(12) United States Patent
Chen et al.

(10) Patent No.: US 7,829,469 B2
(45) Date of Patent: Nov. 9, 2010

(54) METHOD AND SYSTEM FOR UNIFORMITY CONTROL IN BALLISTIC ELECTRON BEAM ENHANCED PLASMA PROCESSING SYSTEM

(75) Inventors: Lee Chen, Cedar Creek, TX (US);
Hiromasa Mochiki, Kofu (JP)

(73) Assignee: Tokyo Electron Limited, Tokyo (JP)

( * ) Notice: Subject to any disclaimer, the term of this patent is extended or adjusted under 35 U.S.C. 154(b) by 902 days.

(21) Appl. No.: 11/608,889

(22) Filed: Dec. 11, 2006

(65) Prior Publication Data
US 2008/0135518 A1    Jun. 12, 2008

(51) Int. Cl.
*H01L 21/302* (2006.01)
(52) U.S. Cl. .................. 438/714; 438/706; 438/710; 156/345.44
(58) Field of Classification Search .............. 438/706, 438/710, 712, 714; 156/345.43, 47, 44, 345.47, 156/48
See application file for complete search history.

(56) References Cited

U.S. PATENT DOCUMENTS

| 5,685,949 A * | 11/1997 | Yashima ............... 438/694 |
| 7,048,837 B2 * | 5/2006 | Somekh et al. ....... 204/192.13 |
| 2002/0182880 A1 * | 12/2002 | Zhu et al. ............. 438/724 |
| 2003/0164142 A1 * | 9/2003 | Koshimizu ............ 118/409 |

* cited by examiner

*Primary Examiner*—Lan Vinh
(74) *Attorney, Agent, or Firm*—Oblon, Spivak, McClelland, Maier & Neustadt, L.L.P.

(57) ABSTRACT

A method and system for adjusting and controlling the plasma uniformity in a plasma processing system is described. The plasma processing system includes an electron source electrode to which direct current (DC) power is coupled in order to generate a ballistic electron beam during the etching of the substrate. A ring electrode, provided about a periphery of the substrate and opposite the electron source electrode, is utilized to create a ring hollow cathode plasma to affect changes in the distribution of plasma density.

16 Claims, 10 Drawing Sheets

METHOD AND SYSTEM FOR UNIFORMITY CONTROL IN BALLISTIC ELECTRON BEAM ENHANCED PLASMA PROCESSING SYSTEM

BACKGROUND OF THE INVENTION

1. Field of Invention

The present invention relates to a method and system for plasma processing a substrate, and more particularly to a method and system for adjusting process uniformity during plasma processing.

2. Description of Related Art

During semiconductor processing, a (dry) plasma etch process can be utilized to remove or etch material along fine lines or within vias or contacts patterned on a silicon substrate. The plasma etch process generally involves positioning a semiconductor substrate with an overlying patterned, protective layer, for example a photoresist layer, in a processing chamber. Once the substrate is positioned within the chamber, an ionizable, dissociative gas mixture is introduced within the chamber at a pre-specified flow rate, while a vacuum pump is throttled to achieve an ambient process pressure.

Thereafter, a plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, etc.) in the selected regions of the substrate. Such substrate materials where etching is required include silicon dioxide ($SiO_2$), low-k dielectric materials, poly-silicon, and silicon nitride.

SUMMARY OF THE INVENTION

The present invention relates to a method and system for plasma processing a substrate.

According to one embodiment, a method and system is described for etching a substrate using plasma enhanced by a ballistic electron beam.

According to another embodiment, a method and system is described for adjusting the spatial distribution of plasma density in a ballistic electron beam enhanced plasma etching process.

According to yet another embodiment, a method and system is described for creating a balanced hollow cathode plasma surrounding an unbalanced hollow cathode plasma in order to adjust the distribution of plasma density. A ring electrode is provided about a periphery of the substrate and opposite an electron source electrode. Direct current (DC) power is coupled to the electron source electrode in order to form a ballistic electron beam, and DC power is coupled to the ring electrode in order to adjust the plasma density at the substrate edge.

According to another embodiment, a method of etching a thin film on a substrate using a plasma processing system having a ballistic electron beam is described, including: disposing the substrate on a substrate holder in the plasma processing system; coupling direct current (DC) power at a first DC voltage to an electron source electrode opposing the substrate on the substrate holder within the plasma processing system in order to create the ballistic electron beam; coupling alternating current (AC) power to the substrate holder in order to form a processing plasma in the plasma processing system; and coupling DC power at a second DC voltage to a ring electrode located beyond a peripheral edge of the substrate and opposite the electron source electrode in order to increase the plasma density of the processing plasma near the peripheral edge of the substrate.

According to another embodiment, a plasma processing system configured to etch a substrate is described, including: a plasma processing chamber configured to facilitate the formation of a processing plasma; a substrate holder coupled to the plasma processing chamber and configured to support the substrate; an electron source electrode coupled to the plasma processing chamber and located opposite the substrate on the substrate holder, and configured to contact the processing plasma; an AC power system coupled to the plasma processing chamber, and configured to couple at least one AC signal to the substrate holder in order to form the processing plasma; a ring electrode coupled to the plasma processing chamber and located beyond a peripheral edge of the substrate and opposite the electron source electrode, and configured to contact the processing plasma; and a DC power system coupled to the plasma processing chamber, and configured to couple DC power at a first DC voltage to the electron source electrode in order to form a ballistic electron beam through the processing plasma and configured to couple DC power at a second DC voltage to the ring electrode in order to increase the plasma density of the processing plasma near a peripheral edge of the substrate.

According to yet another embodiment, a plasma processing system configured to etch a substrate is described, including: a plasma processing chamber configured to facilitate the formation of a processing plasma to interact with the substrate; means for supporting the substrate within the plasma processing chamber; means for forming the processing plasma in the plasma processing chamber; means for coupling DC power to the plasma processing chamber in order to facilitate the formation of a ballistic electron beam to interact with the substrate; and means for adjusting the plasma density near a peripheral edge of the substrate.

DETAILED DESCRIPTION OF PREFERRED EMBODIMENTS

In the following description, for purposes of explanation and not limitation, specific details are set forth, such as a particular geometry of the plasma processing system and descriptions of various processes. However, it should be understood that the invention may be practiced in other embodiments that depart from these specific details.

In material processing methodologies, pattern etching comprises the application of a thin layer of light-sensitive material, such as photo-resist, to an upper surface of a substrate that is subsequently patterned in order to provide a mask for transferring this pattern to the underlying thin film on a substrate during etching. The patterning of the light-sensitive material generally involves exposure of the light-sensitive material to a geometric pattern of electromagnetic (EM) radiation using, for example, a micro-lithography system, followed by the removal of the irradiated regions of the light-sensitive material (as in the case of positive photo-resist), or non-irradiated regions (as in the case of negative resist) using a developing solvent. Moreover, this mask layer may comprise multiple sub-layers.

During pattern etching, a dry plasma etching process is often utilized, wherein plasma is formed from a process gas by coupling electromagnetic (EM) energy, such as radio frequency (RF) power, to the process gas in order to heat electrons and cause subsequent ionization and dissociation of the atomic and/or molecular composition of the process gas. Furthermore, negative, high voltage direct current (DC) electrical power can be coupled to the plasma processing system in order to create a ballistic electron beam that strikes the substrate surface during a fraction of the RF cycle, i.e., the positive half-cycle of the coupled RF power. It has been observed that the ballistic electron beam can enhance the properties of the dry plasma etching process by, for example, improving the etch selectivity between the underlying thin film (to be etched) and the mask layer, reducing charging damage such as electron shading damage, etc. Additional details regarding the generation of a ballistic electron beam are disclosed in pending U.S. patent application Ser. No. 11/156,559, entitled "Plasma processing apparatus and method" and published as US patent application no. 2006/0037701A1; the entire contents of which are herein incorporated by reference in their entirety.

Figure 1:
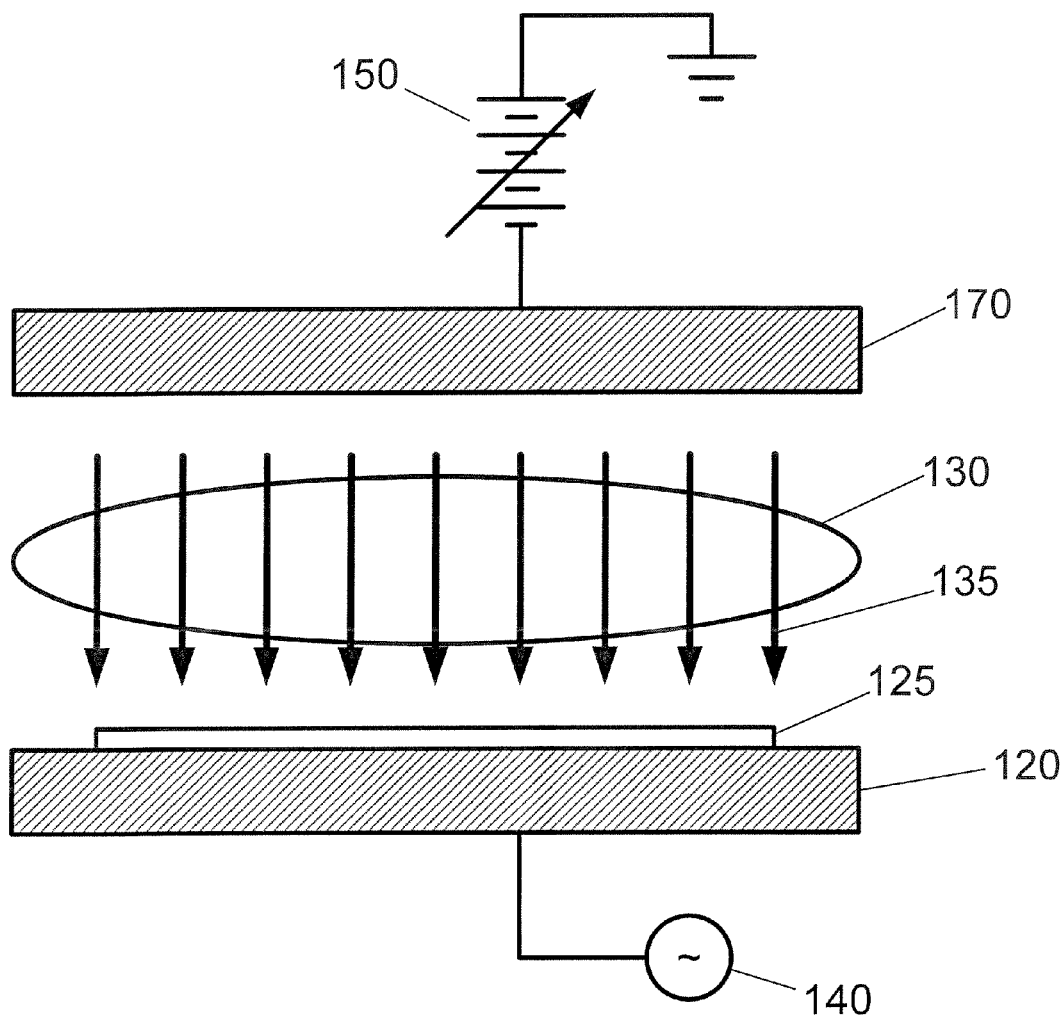
FIG. 1 presents a schematic representation of a plasma processing system utilizing an electron beam assisted plasma.

Referring now to FIG. 1, a schematic illustration of a plasma processing system incorporating a ballistic electron beam is provided. The plasma processing system comprises a first electrode 120 and a second electrode 170 disposed opposite each other within a process chamber, wherein the first electrode 120 is configured to support a substrate 125. The first electrode 120 is provided as part of the substrate holder and coupled to a RF generator 140 configured to provide RF power at a RF frequency. The coupling of RF power to the first electrode facilitates the formation of plasma 130. Additionally, the plasma processing system comprises a DC power supply 150 configured to provide a DC voltage to the second electrode 170, which serves as an electron source electrode. Here, the coupling of a negative DC voltage to the second electrode 170 facilitates the formation of ballistic electron beam 135. The electron beam power is derived from the superposition of the negative DC voltage on the second electrode 170. As is described in published US patent application no. 2006/0037701A1, the application of negative DC power to the plasma processing system affects the formation of a ballistic (or collision-less) electron beam that strikes the surface of substrate 125.

In general, the ballistic electron beam can be implemented with any type of plasma processing system, as will be shown below. In this example, the negative DC voltage is superimposed on an upper electrode (i.e., electron source electrode) opposing a RF powered electrode upon which the substrate rests. Hence, the invention is not to be limited by this example. It is merely utilized for illustration purposes.

While the ballistic electron beam is important for enhancing etch properties, the uniformity of the electron beam flux $I_e(r)$ is also important. Although the electron beam is collision-less, it can transfer energy to the plasma via known physical phenomena, resulting in an increase in the bulk plasma density. One possible theory for the transfer of energy from the electron beam into the bulk plasma and its subsequent ionization may be a dual-stream plasma instability that couples the run-away electron beam energy into the ion wave. Therein, the bulk Boltzmann electrons of a particular energy group are electrostatically accelerated by the ion wave (gaining energy through Landau damping) to a higher energy that subsequently ionizes neutral species. The source of electrons for the ballistic electron beam is secondary electrons generated from the ion bombardment of the second electrode 170. Therefore, the uniformity of the ballistic electron beam flux to substrate 125 depends upon the uniformity of the plasma and ion flux to electrode 170, as well as other parameters. That is, non-uniformity in the plasma can cause non-uniformity in electron beam flux, which exacerbates non-uniformity of the plasma.

The collision-less electron beam flux $I_e(r)$ can be expressed as:

$$I_e(r) \sim v_{B1} n_e(r) [V_p(r) - V]^{3/2}, \quad (1)$$

where $v_{B1}$ represents the ion Bohm velocity at electrode 170, $V_p(r)$ represents the radial variation of the plasma potential, V represents the electrode potential (i.e., second electrode 170), and $n_e(r)$ represents the radial variation of the electron density (or bulk plasma density) at the edge of the sheath at the second electrode 170. Typically, it is very reasonable to assume a radially constant $V_p(r)$ at the edge of the sheath at the second electrode 170. Therefore, the electron beam flux $I_e(r)$ is predominantly affected by the (sheath-edge) electron density $n_e(r)$.

As an example, when coupling RF power to the first electrode 120 to form plasma 130 as shown in FIG. 1, the inventors have observed a distribution of electron density $n_e(r)$ that is high at the center of substrate 125 and relatively lower at the edge of substrate 125. The center-high voltage standing-wave nature of a low-inductive-mode, capacitively coupled plasma (such as that illustrated in FIG. 1) yields such a distribution of $n_e(r)$. This variation in $n_e(r)$ from center to edge is further amplified by the distribution of the electron beam flux (which is in turn dependent upon $n_e(r)$ as shown in equation (1)) and other edge-loss mechanisms.

Additionally, the inventors have observed that the behavior of the electrode sheath adjacent the first electrode 120 resembles a time modulated hollow cathode, or unbalanced hollow cathode in time. For example, during a fraction of the RF cycle for RF power coupled at electrode 120 (e.g., negative half-cycle), electrons are repelled by a relatively thicker electrode sheath and thus trapped between the first and second electrodes, 120 and 170. Alternatively, during another fraction of the RF cycle for RF power coupled at electrode 120 (e.g., positive half-cycle), electrons are attracted by a relatively thinner electrode sheath and thus the electrons shower electrode 120.

According to an embodiment, a ring-hollow cathode is formed beyond a peripheral edge of the unbalanced hollow cathode above substrate 125. The ring-hollow-cathode can raise the electron density at the peripheral edge of substrate 125, thus providing a more uniform distribution of electron density $n_e(r)$ above substrate 125, which in turn provides more uniform electron beam flux as discussed above. The ring-hollow-cathode may be formed by providing a ring electrode beyond a peripheral edge of substrate 125 and coupling a negative DC voltage to the ring electrode. For example, the DC voltage may be substantially equivalent to the DC voltage applied to the second electrode 170, thereby forming a balanced hollow cathode.

Figure 2:
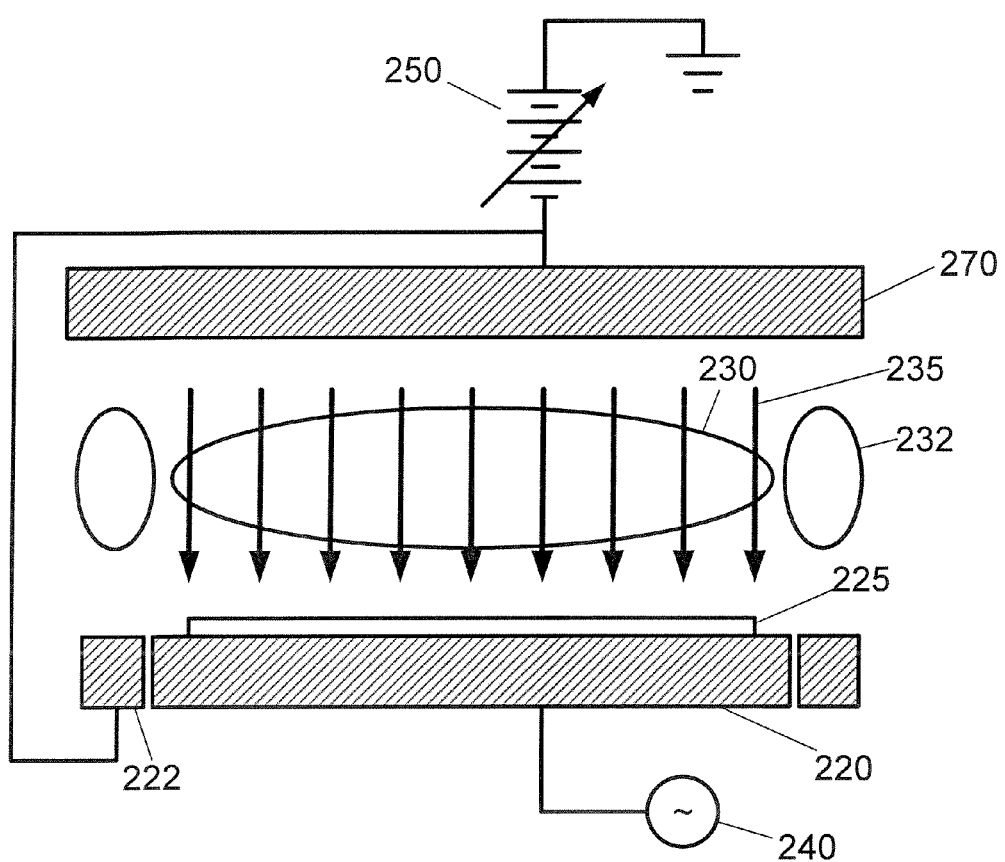
FIG. 2 presents a schematic representation of a plasma processing system according to an embodiment of the invention.

Referring now to FIG. 2, a schematic illustration of a plasma processing system incorporating a ballistic electron beam is provided according to one embodiment. The plasma processing system comprises a first electrode 220 and a second electrode 270 disposed opposite each other within a process chamber, wherein the first electrode 220 is configured to support a substrate 225. The first electrode 220 is coupled to a RF generator 240 configured to provide RF power at a RF frequency. The coupling of RF power to the first electrode facilitates the formation of plasma 230. Additionally, the plasma processing system comprises a DC power supply 250 configured to provide a DC voltage to the second electrode 270. Here, the coupling of a negative DC voltage to the second electrode 270 (i.e., electron source) facilitates the formation of ballistic electron beam 235. The electron beam power is derived from the superposition of the negative DC voltage on the second electrode 270. As is described in published US patent application no. 2006/0037701A1, the application of negative DC power to the plasma processing system affects the formation of a ballistic (or collision-less) electron beam that strikes the surface of substrate 225.

Additionally, as shown in FIG. 2, the plasma processing system comprises a ring electrode 222 positioned beyond a peripheral edge of substrate 225. The ring electrode 222 opposes the second electrode 270 and, when coupled to DC power supply 250 (as shown), the ring electrode 222 and second electrode 270 form a ring hollow cathode plasma 232.

Figure 3:
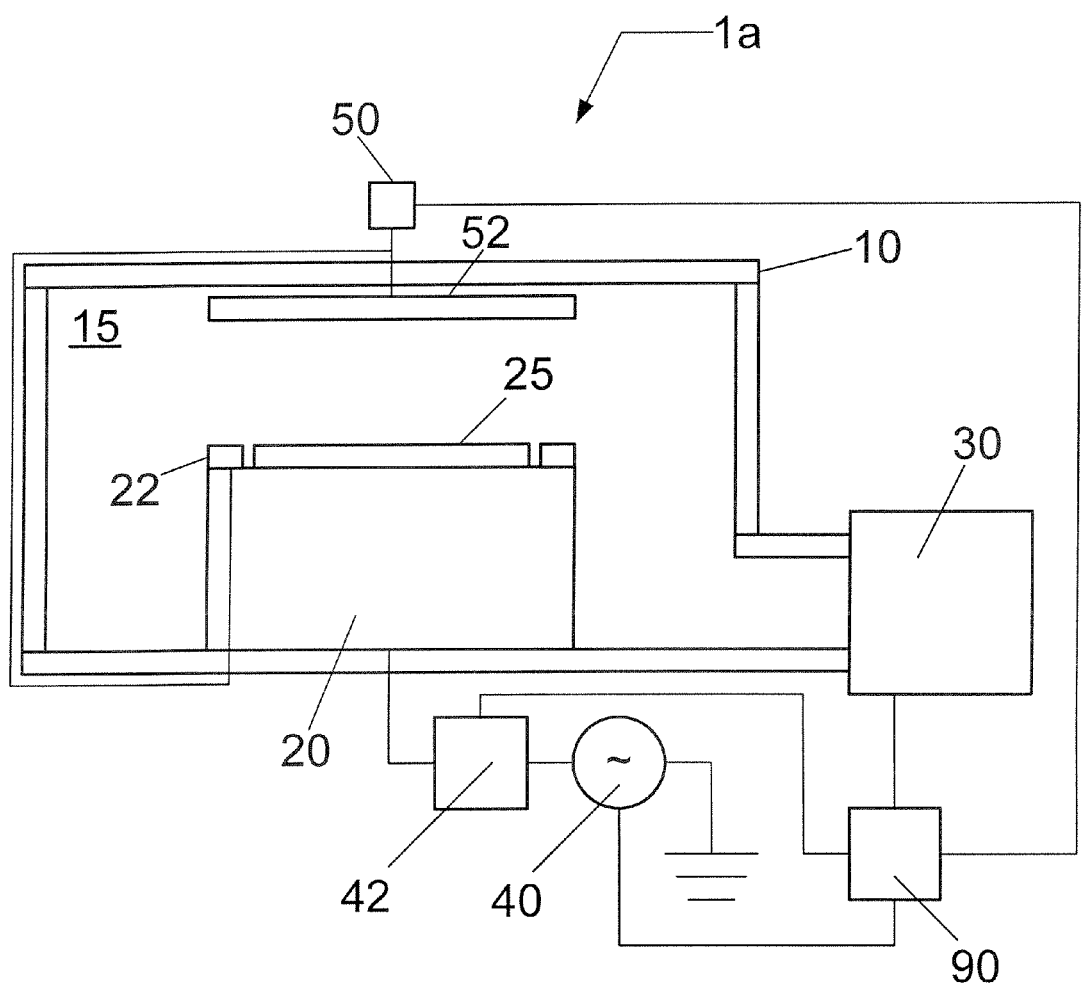
FIG. 3 shows a schematic diagram of a plasma processing system according to another embodiment of the invention.

FIG. 3 illustrates a plasma processing system according to another embodiment. Plasma processing system 1a comprises a plasma processing chamber 10, substrate holder 20, upon which a substrate 25 to be processed is affixed, and vacuum pumping system 30. As used herein, the term "substrate holder" means any object configured to support a substrate for processing in a plasma process chamber. A substrate holder may include any one or more of an electrode, a backside gas supply system, an electrostatic clamp, etc. as will be discussed below. Substrate 25 can be a semiconductor substrate, a wafer or a liquid crystal display. Plasma processing chamber 10 can be configured to facilitate the generation of plasma in processing region 15 adjacent a surface of substrate 25. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 1a can be configured to process a substrate of any size, such as 200 mm substrates, 300 mm substrates, or larger.

Substrate 25 can be affixed to the substrate holder 20 via an electrostatic clamping system. Furthermore, substrate holder 20 can further include a cooling system or heating system that includes a re-circulating fluid flow that receives heat from substrate holder 20 and transfers heat to a heat exchanger system (not shown) when cooling, or transfers heat from the heat exchanger system to the fluid flow when heating. Moreover, gas can be delivered to the back-side of substrate 25 via a backside gas system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the backside gas (e.g., helium) pressure can be independently varied between the center and the edge of substrate 25. In other embodiments, heating/cooling elements, such as resistive heating elements, or thermoelectric heaters/coolers can be included in the substrate holder 20, as well as the chamber wall of the plasma processing chamber 10 and any other component within the plasma processing system 1a.

In the embodiment shown in FIG. 3, substrate holder 20 can comprise an electrode through which RF power is coupled to the processing plasma in process space 15. For example, substrate holder 20 can be electrically biased at a RF voltage via the transmission of RF power from a RF generator 40 through an optional impedance match network 42 to substrate holder 20. The RF bias can serve to heat electrons to form and maintain plasma, or affect the ion energy distribution function within the sheath, or both. In this configuration, the system can operate as a reactive ion etch (RIE) reactor, wherein the chamber and an upper gas injection electrode serve as ground surfaces. A typical frequency for the RF bias can range from 0.1 MHz to 100 MHz. RF systems for plasma processing are well known to those skilled in the art.

Furthermore, impedance match network 42 serves to improve the transfer of RF power to plasma in plasma processing chamber 10 by reducing the reflected power. Match network topologies (e.g. L-type, π-type, T-type, etc.) and automatic control methods are well known to those skilled in the art.

Referring still to FIG. 3, plasma processing system 1a further comprises a direct current (DC) power supply 50 coupled to an upper electrode 52 opposing substrate 25. The upper electrode 52 may comprise an electrode plate. The electrode plate may comprise a silicon-containing electrode plate. Moreover, the electrode plate may comprise a doped silicon electrode plate. The DC power supply can include a variable DC power supply. Additionally, the DC power supply can include a bipolar DC power supply. The DC power supply 50 can further include a system configured to perform at least one of monitoring adjusting, or controlling the polarity, current, voltage, or on/off state of the DC power supply 50. Once plasma is formed, the DC power supply 50 facilitates the formation of a ballistic electron beam. An electrical filter may be utilized to de-couple RF power from the DC power supply 50.

For example, the DC voltage applied to electrode 52 by DC power supply 50 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 52. The surface of the upper electrode 52 facing the substrate holder 20 may be comprised of a silicon-containing material.

Furthermore, substrate holder 20 comprises a ring electrode 22 positioned beyond a peripheral edge of substrate 25 and opposite upper electrode 52. The ring electrode is coupled to the DC power supply 50. The DC voltage provided to the ring electrode 22 can be substantially the same as the DC voltage provided to the upper electrode 52.

Vacuum pump system 30 can include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP can be employed. TMPs can be used for low pressure processing, typically less than 50 mTorr. For high pressure processing (i.e., greater than 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Referring still to FIG. 3, plasma processing system 1a further comprises a controller 90 that comprises a microprocessor, memory, and a digital I/O port capable of generating control voltages sufficient to communicate and activate inputs to plasma processing system 1a as well as monitor outputs from plasma processing system 1a. Moreover, controller 90 can be coupled to and can exchange information with RF generator 40, impedance match network 42, DC power supply 50, the gas injection system (not shown), vacuum pumping system 30, as well as the backside gas delivery system (not shown), the substrate/substrate holder temperature measurement system (not shown), and/or the electrostatic clamping system (not shown). A program stored in the memory can be utilized to activate the inputs to the aforementioned components of plasma processing system 1a according to a process recipe in order to perform the method of etching a thin film. One example of controller 90 is a DELL PRECISION WORKSTATION 610™, available from Dell Corporation, Austin, Tex.

Controller 90 may be locally located relative to the plasma processing system 1a, or it may be remotely located relative to the plasma processing system 1a via an internet or intranet. Thus, controller 90 can exchange data with the plasma processing system 1a using at least one of a direct connection, an intranet, or the internet. Controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, or the internet.

In the embodiment shown in FIG. 4, the plasma processing system 1b can be similar to the embodiment of FIG. 3 and further comprise either a stationary, or mechanically or electrically rotating magnetic field system 60, in order to potentially increase plasma density and/or improve plasma processing uniformity, in addition to those components described with reference to FIG. 3. Moreover, controller 90 can be coupled to magnetic field system 60 in order to regulate the speed of rotation and field strength. The design and implementation of a rotating magnetic field is well known to those skilled in the art.

Figure 4:
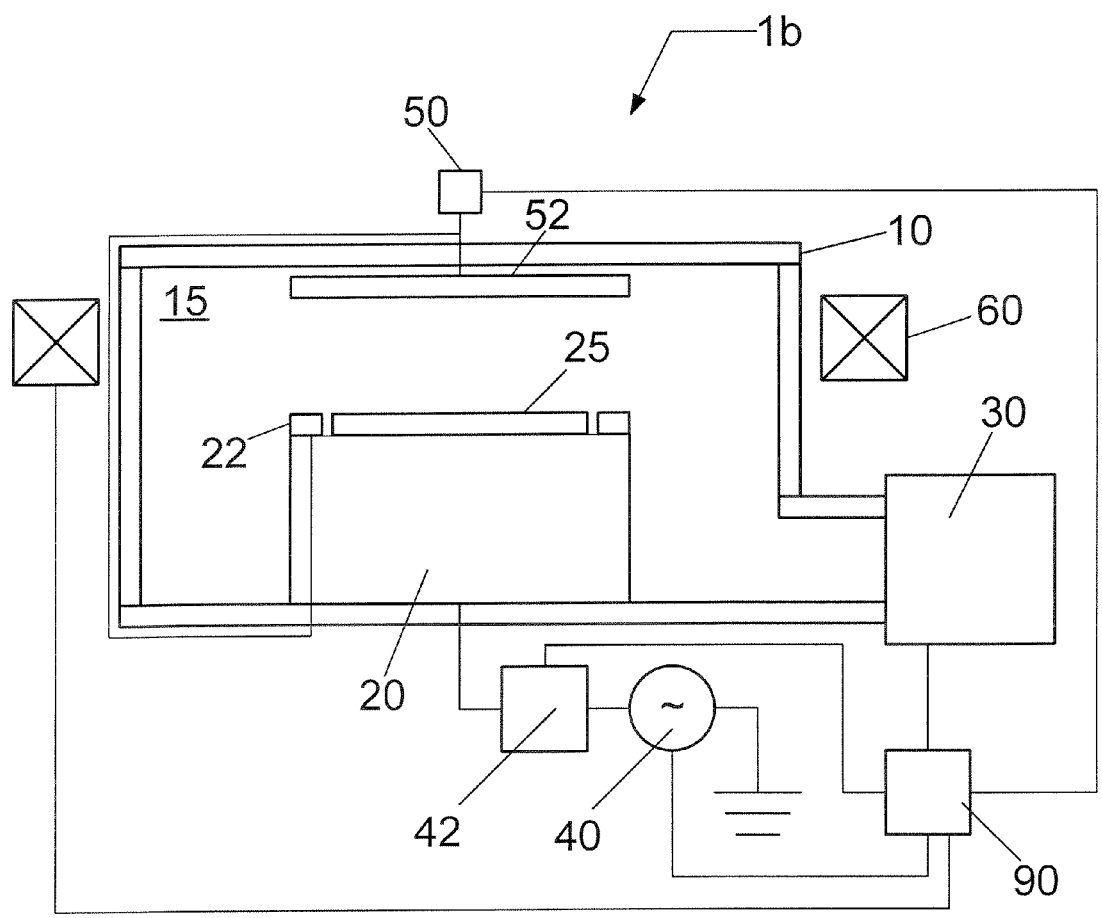
FIG. 4 shows a schematic diagram of a plasma processing system according to another embodiment of the invention.
Figure 5:
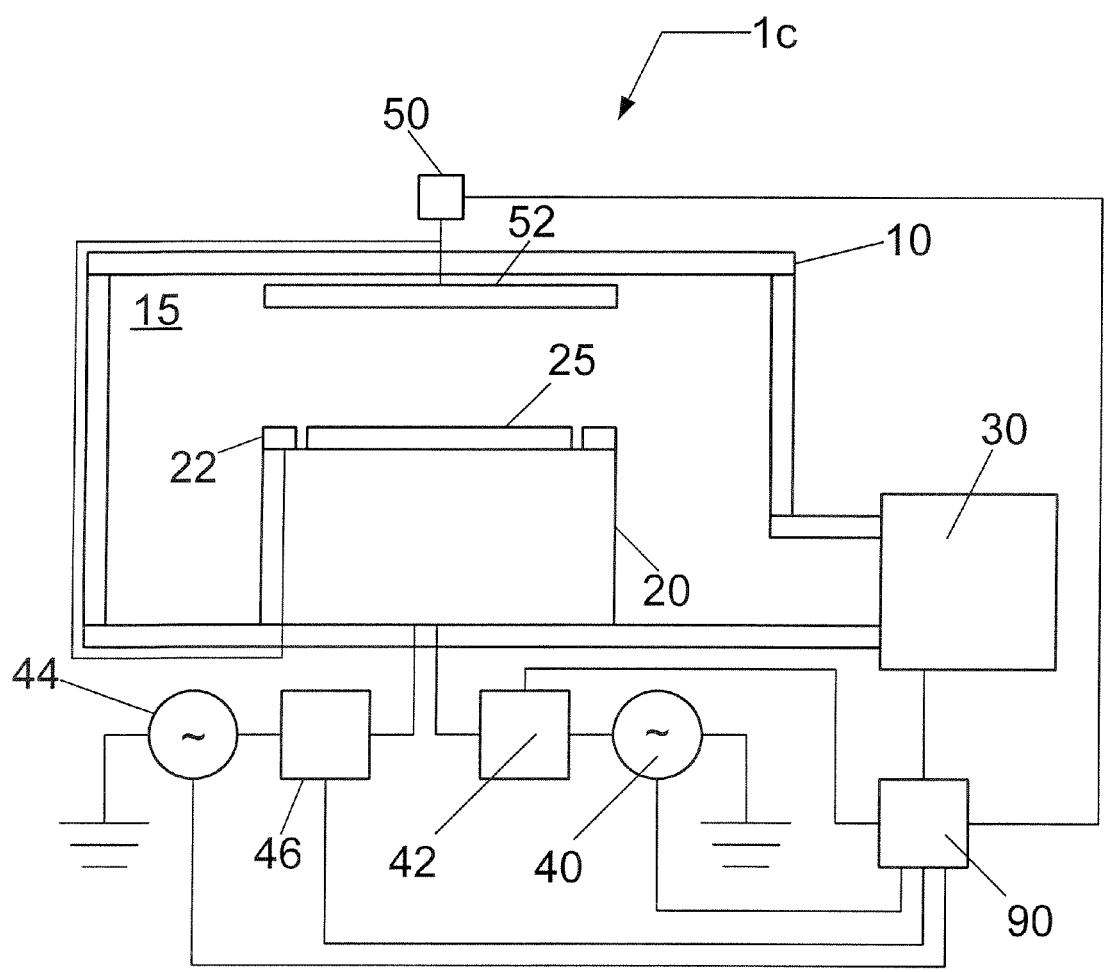
FIG. 5 shows a schematic diagram of a plasma processing system according to another embodiment of the invention.

In the embodiment shown in FIG. 5, the plasma processing system 1c can, for example, be similar to the embodiments of FIGS. 3 and 4, and can further comprise a second RF generator 44 configured to couple RF power to substrate holder 20 through another optional impedance match network 46. A typical frequency for the application of RF power to substrate holder 20 can range from about 0.1 MHz to about 200 MHz for either the first RF generator 40 or the second RF generator 44 or both. The RF frequency for the second RF generator 44 can be relatively greater than the RF frequency for the first RF generator 44. Furthermore, the RF power to the substrate holder 20 from RF generator 40 can be amplitude modulated, or the RF power to the substrate holder 20 from RF generator 44 can be amplitude modulated, or both RF powers can be amplitude modulated. Desirably, the RF power at the higher RF frequency is amplitude modulated. Moreover, controller 90 is coupled to the second RF generator 44 and impedance match network 46 in order to control the application of RF power to substrate holder 20. The design and implementation of an RF system for a substrate holder is well known to those skilled in the art.

Figure 6:
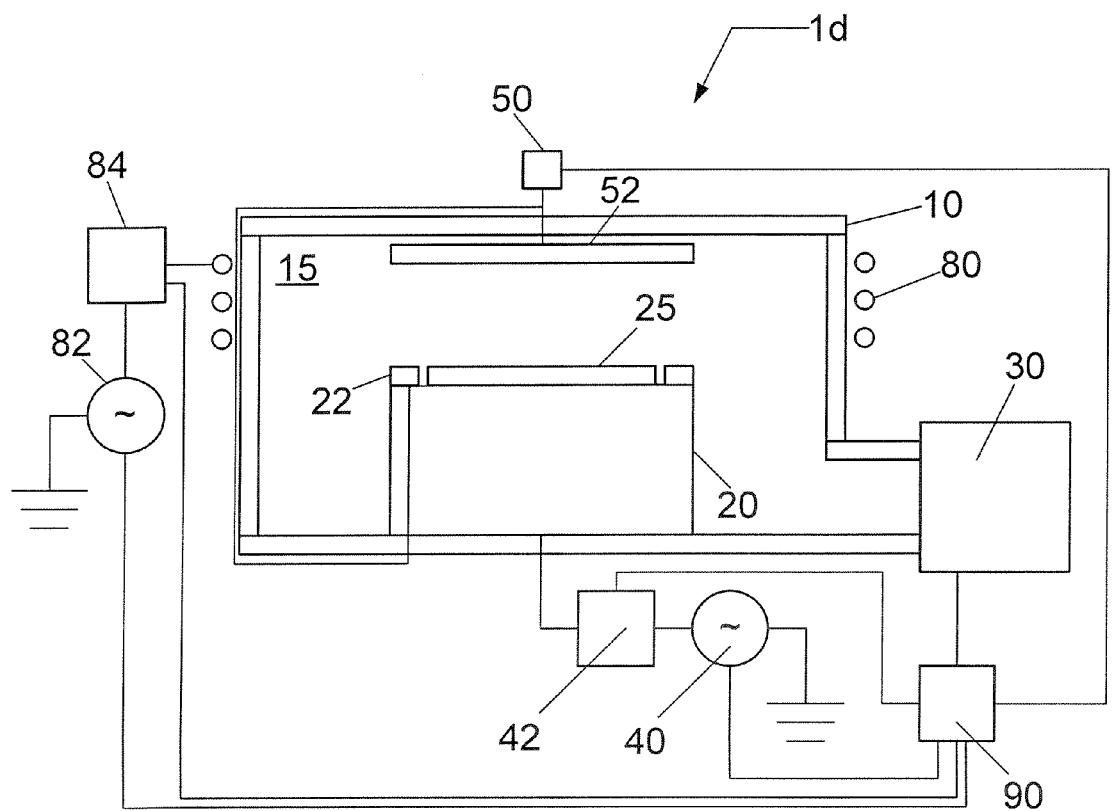
FIG. 6 shows a schematic diagram of a plasma processing system according to another embodiment of the invention.

In the embodiment shown in FIG. 6, the plasma processing system 1d can, for example, be similar to the embodiments of FIGS. 3, 4 and 5, and can further comprise an inductive coil 80 to which RF power is coupled via RF generator 82 through an optional impedance match network 84. RF power is inductively coupled from inductive coil 80 through a dielectric window (not shown) to plasma processing region 15. A typical frequency for the application of RF power to the inductive coil 80 can range from about 10 MHz to about 100 MHz. Similarly, a typical frequency for the application of power to the chuck electrode can range from about 0.1 MHz to about 100 MHz. In addition, a slotted Faraday shield (not shown) can be employed to reduce capacitive coupling between the inductive coil 80 and plasma. Moreover, controller 90 is coupled to RF generator 82 and impedance match network 84 in order to control the application of power to inductive coil 80. In an alternate embodiment, inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 7:
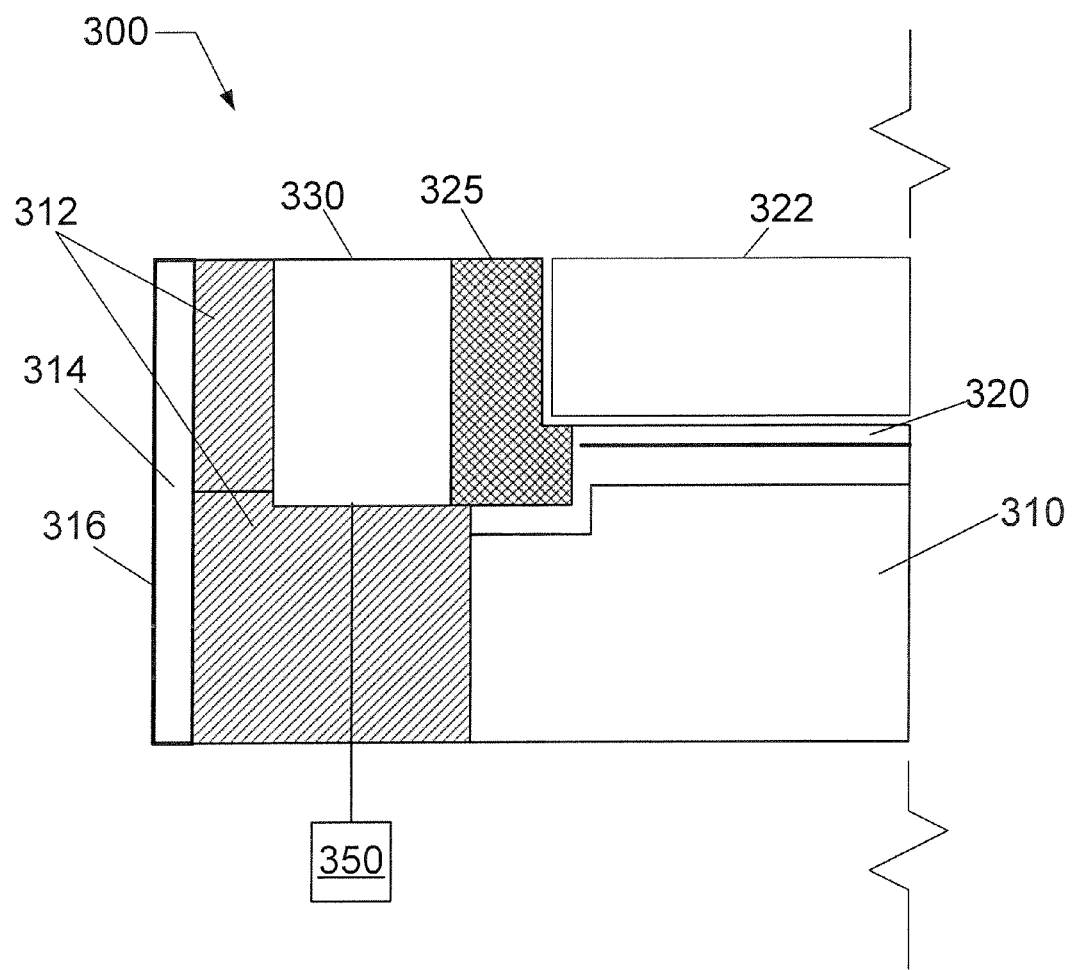
FIG. 7 shows an exploded view of a substrate holder having a ring electrode according to another embodiment of the invention.

Referring now to FIG. 7, an exploded view of a substrate holder 300 is provided according to another embodiment. Substrate holder 300 may be utilized in any of the plasma processing systems described in FIGS. 2 through 6, and combinations thereof. Substrate holder 300 comprises a RF biasable electrode 310, an electrode insulator 312, a ground wall 314 with surface anodization 316, and focus ring 325. The substrate holder 300 further includes an electrostatic clamp (ESC) 320 in order to facilitate holding a substrate 322. Although, not shown in detail in FIG. 1, the electrostatic clamp 320 typically comprises a clamp electrode encased within a ceramic body. The focus ring 325 is generally fabricated from a silicon-containing material such as, for example, silicon or silicon carbide, when processing silicon substrates.

Furthermore, substrate holder 300 comprises a ring electrode 330 that is configured to be coupled to a DC power supply 350. The ring electrode 325 is fabricated from a DC conductive material. For example, the ring electrode 325 can be fabricated from a metal or metal-containing material, such as aluminum, anodized aluminum, or aluminum having a ceramic coating. The ceramic coating can include aluminum oxide or yttrium oxide. The ceramic coating can include an oxide or fluoride of a rare earth metal. For example, the ceramic coating can include a material selected from the group consisting of $Al_2O_3$, $Sc_2O_3$, $Sc_2F_3$, $YF_3$, $La_2O_3$, $Y_2O_3$, and $DyO_3$. Additionally, for example, the ring electrode 325 can be fabricated from a silicon-containing material, such as doped silicon.

The strength, or density, of the ring hollow plasma can be increased by increasing the amount of surface area of the ring electrode 330 that is exposed to the ring hollow plasma. Alternatively, the density of the ring hollow plasma can be decreased by decreasing the amount of surface area of the ring electrode 330 that is exposed to the ring hollow plasma.

Figure 8:
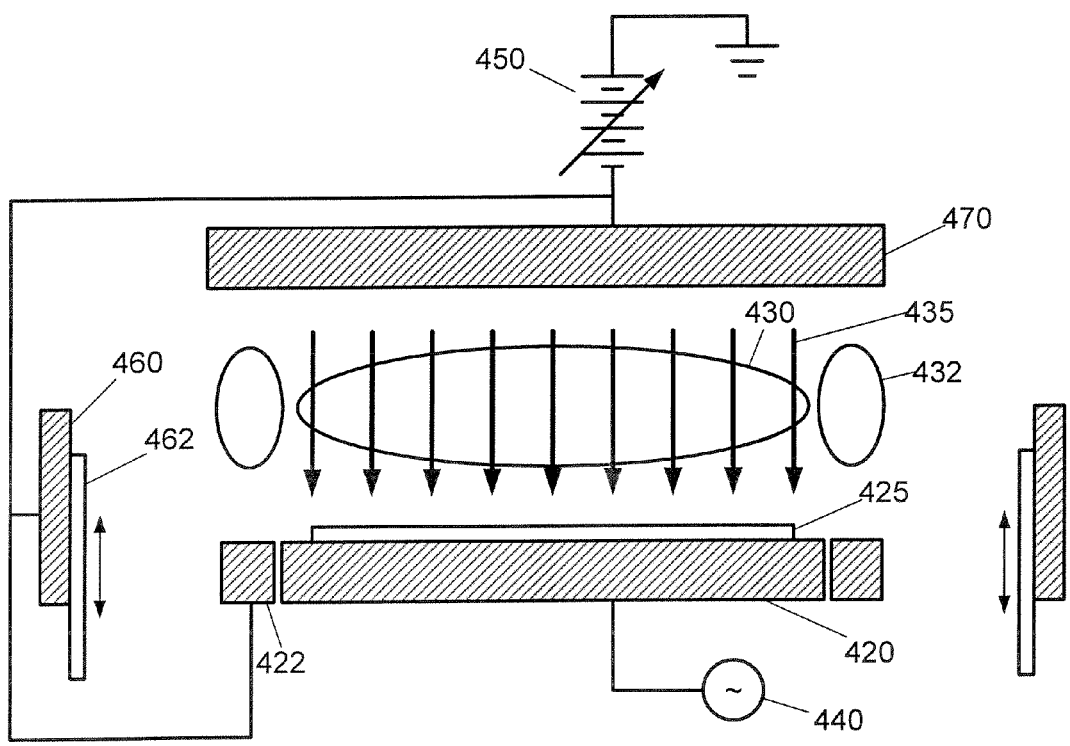
FIG. 8 presents a schematic representation of a plasma processing system according to another embodiment of the invention.

Referring now to FIG. 8, a schematic illustration of a plasma processing system incorporating a ballistic electron beam is provided according to another embodiment. The plasma processing system comprises a first electrode 420 and a second electrode 470 disposed opposite each other within a process chamber, wherein the first electrode 420 is configured to support a substrate 425. The first electrode 420 is coupled to a RF generator 440 configured to provide RF power at a RF frequency. The coupling of RF power to the first electrode facilitates the formation of plasma 430. Additionally, the plasma processing system comprises a DC power supply 450 configured to provide a DC voltage to the second electrode 470. Here, the coupling of a negative DC voltage to the second electrode 470 facilitates the formation of ballistic electron beam 435. The electron beam power is derived from the superposition of the negative DC voltage on the second electrode 470. As is described in published US patent application no. 2006/0037701A1, the application of negative DC power to the plasma processing system affects the formation of a ballistic (or collision-less) electron beam that strikes the surface of substrate 425.

Additionally, as shown in FIG. 8, the plasma processing system comprises a ring electrode 422 positioned beyond a peripheral edge of substrate 425. The ring electrode 422 opposes the second electrode 470 and, when coupled to DC power supply 450 (as shown), the ring electrode 422 and second electrode 470 form a ring hollow cathode plasma 432.

Furthermore, as shown in FIG. 8, the plasma processing system comprises an auxiliary electrode 460 having a cover plate 462 configured to cover a portion of the auxiliary electrode 460. The auxiliary electrode 460 can be located beyond a peripheral edge of both the upper electrode 470 and the ring electrode 422. For example, the auxiliary electrode 460 may be positioned along an outer chamber wall of the plasma processing system. Additionally, the auxiliary electrode 460 is coupled to DC power supply 450. The auxiliary electrode 460 is configured to move relative to the position of the cover plate 462 in order to adjust the amount of surface area of auxiliary electrode 460 that is exposed to the ring hollow cathode plasma 432. Alternatively, cover plate 462 is configured to move relative to the position of the auxiliary electrode 460 in order to adjust the amount of surface area of auxiliary electrode 460 that is exposed to the ring hollow cathode plasma 432.

By adjusting the position of the cover plate 462 relative to the auxiliary electrode 460 or vice versa, the amount of surface area of auxiliary electrode 460 that is exposed to the ring hollow cathode plasma 432 can be varied. The density of the ring hollow cathode plasma 432 can be increased by increasing the exposed surface area, and the density of the ring hollow cathode plasma 432 can be decreased by decreasing the exposed surface area. In this regard, the auxiliary electrode 460 and cover plate 462 may be used without the ring electrode 422.

The auxiliary electrode 460 is fabricated from a DC conductive material. For example, the auxiliary electrode 460 can be fabricated from a metal or metal-containing material, such as aluminum, anodized aluminum, or aluminum having a ceramic coating. Additionally, for example, the auxiliary electrode 460 can be fabricated from a silicon-containing material, such as doped silicon. The cover plate 462 is fabricated from a non-conductive material. For example, the cover plate 462 can be fabricated from a ceramic, polymer or plastic, such as quartz, sapphire, silicon, silicon nitride, silicon carbide, alumina, aluminum nitride, Teflon®, polyimide, etc.

Figure 9:
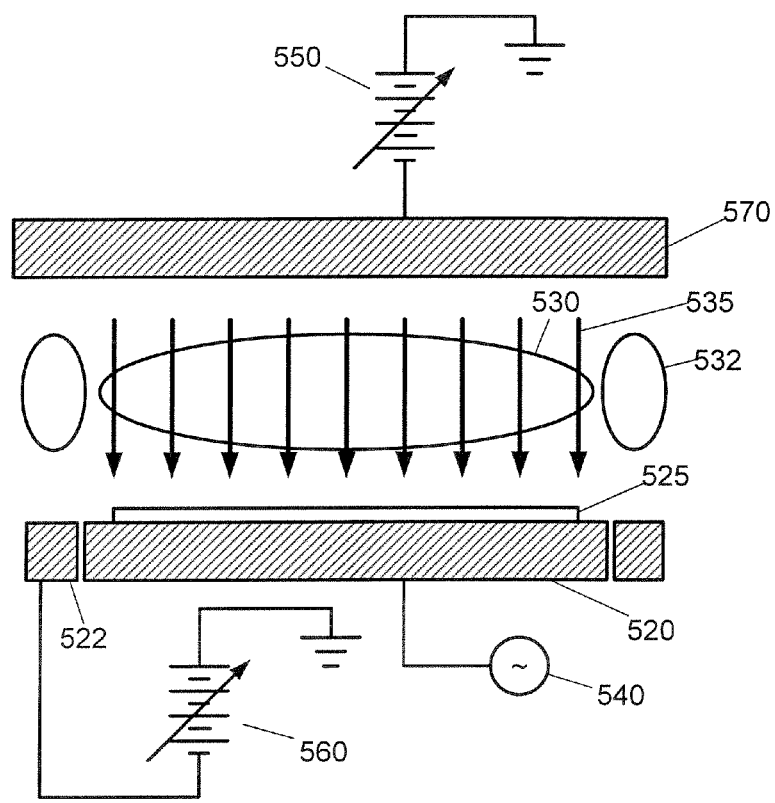
FIG. 9 presents a schematic representation of a plasma processing system according to yet another embodiment of the invention.

Referring now to FIG. 9, a schematic illustration of a plasma processing system incorporating a ballistic electron beam is provided according to another embodiment. The plasma processing system comprises a first electrode 520 and a second electrode 570 disposed opposite each other within a process chamber, wherein the first electrode 520 is configured to support a substrate 525. The first electrode 520 is coupled to a RF generator 540 configured to provide RF power at a RF frequency. The coupling of RF power to the first electrode facilitates the formation of plasma 530. Additionally, the plasma processing system comprises a DC power supply 550 configured to provide a DC voltage to the second electrode 570. Here, the coupling of a negative DC voltage to the second electrode 570 facilitates the formation of ballistic electron beam 535. The electron beam power is derived from the superposition of the negative DC voltage on the second electrode 570. As is described in published US patent application no. 2006/0037701A1, the application of negative DC power to the plasma processing system affects the formation of a ballistic (or collision-less) electron beam that strikes the surface of substrate 525.

Additionally, as shown in FIG. 9, the plasma processing system comprises a ring electrode 522 positioned beyond a peripheral edge of substrate 525. The ring electrode 522 opposes the second electrode 570, and it is coupled to a second DC power supply 560. When coupled to the second DC power supply 560 (as shown), the ring electrode 522 and second electrode 570 form a ring hollow cathode plasma 532. By adjusting the voltage (V plus or minus $\delta V$) coupled to the ring electrode 522 from the second DC power supply 560 relative to the voltage (V) applied to the upper electrode 570 from the DC power supply 550, the respective voltage differential ($\delta V$) is utilized to adjust the density of the ring hollow cathode plasma 532. For example, when the absolute value of the voltage difference ($\delta V$), the density of the ring hollow cathode plasma 532 is decreased.

In the following discussion, a method of etching a thin film utilizing a plasma processing system with a ballistic electron beam is presented. For example, the plasma processing system can comprise various elements, such as described in FIGS. 2 through 9, and combinations thereof.

Figure 10:
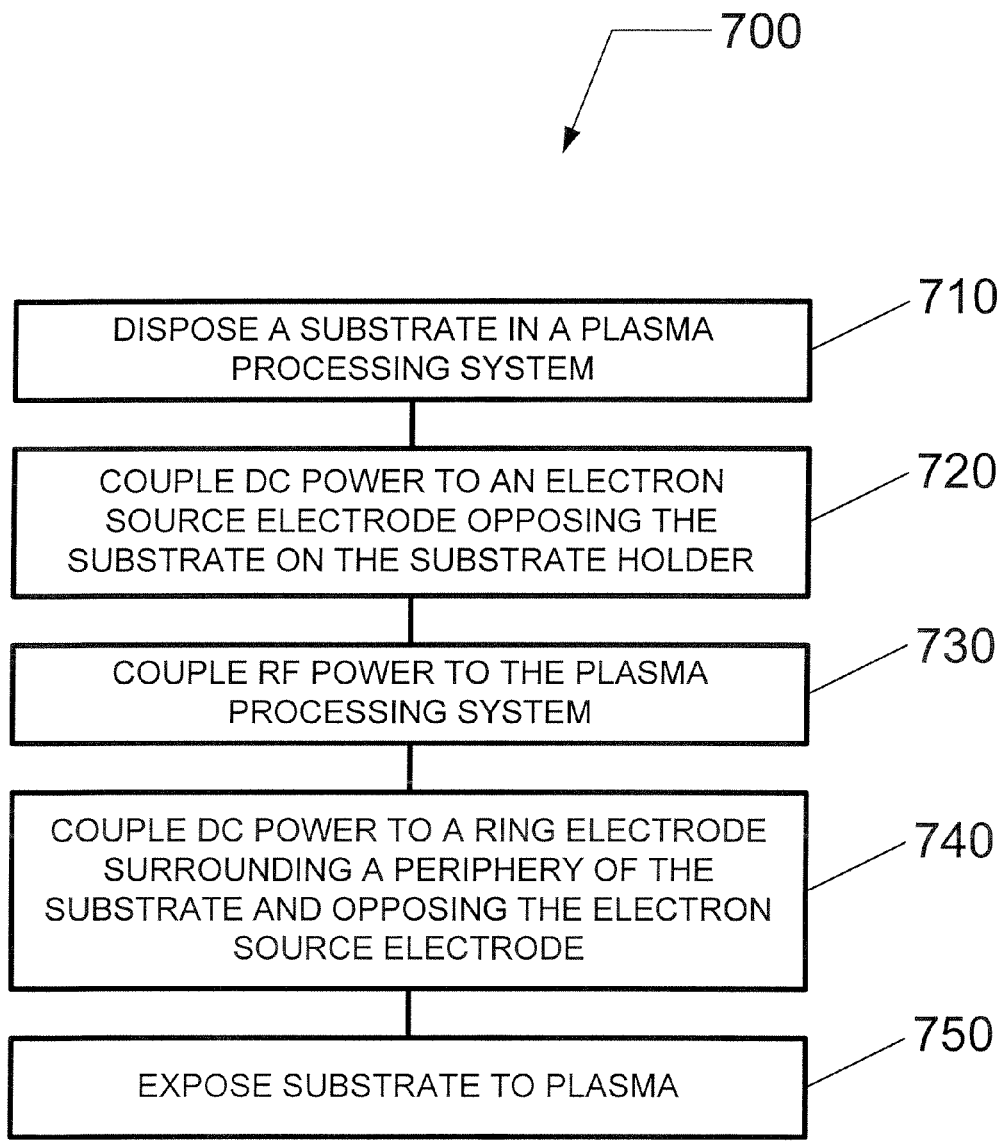
FIG. 10 illustrates a method of treating a substrate using plasma according to another embodiment of the invention.

FIG. 10 presents a flow chart of a method for etching a thin film using a plasma processing system having a ballistic electron beam according to an embodiment of the present invention. Procedure 700 begins at 710 with disposing a substrate on a substrate holder in a plasma processing system configured to form both plasma and a ballistic electron beam.

In 720, to facilitate the formation of the ballistic electron beam, DC power is coupled to an electron source electrode of the plasma processing system (such as any one of the systems shown in FIGS. 2 through 9), and located opposite the substrate holder. For example, the DC voltage applied to the plasma processing system by a DC power supply may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than that is a self-bias voltage generated on an electrode surface of the plasma processing system.

In 730, RF power is coupled to the plasma processing system to form a plasma. RF power may be coupled to the processing system by way of the substrate holder, an inductive coil, or by any other known method for generating a plasma. However, RF is preferably not provided on the electron source electrode having the negative voltage (such as the upper electrode) due to difficulty in controlling a DC voltage level when RF is present.

In 740, to facilitate adjustment of the spatial uniformity of the plasma and ballistic electron beam, a ring electrode is disposed within the plasma processing system (such as any one of the systems shown in FIGS. 2 through 9), and located beyond a peripheral edge of the substrate and opposing the upper electrode. The ring electrode facilitates increasing the plasma density at the edge of the substrate.

The DC voltage coupled to the ring electrode can be substantially the same as the DC voltage coupled to the upper electrode. Alternatively, the DC voltage coupled to the ring electrode can be different than the DC voltage coupled to the upper electrode. For example, the magnitude in the voltage difference between the voltage coupled to the upper electrode and the voltage coupled to the ring electrode may be adjusted to affect changes in the plasma density at the edge of the substrate.

Additionally, the amount of increase to the plasma density above the substrate edge region can be affected by the amount of surface area on the ring electrode exposed to plasma. For example, this surface area may be variable.

In 750, the substrate is exposed to the plasma to facilitate an etching process on the substrate.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of etching a thin film on a substrate using a plasma processing system, comprising:

disposing said substrate on a substrate holder in said plasma processing system;

coupling direct current (DC) power at a first DC voltage to an electron source electrode opposing said substrate on said substrate holder within said plasma processing system in order to create a ballistic electron beam;

coupling alternating current (AC) power to said plasma processing system in order to form a processing plasma in said plasma processing system;

coupling DC power at a second DC voltage to a ring electrode located beyond a peripheral edge of said substrate and opposite said electron source electrode in order to increase the plasma density of said processing plasma near said peripheral edge of said substrate;

coupling DC power at a third DC voltage to an auxiliary electrode located beyond a peripheral edge of said ring electrode; and adjusting the amount of surface area on said auxiliary electrode that is exposed to said processing plasma in order to further alter the amount of increase to the plasma density near the peripheral edge of said substrate.

2. A method of etching a thin film on a substrate using a plasma processing system, comprising:

disposing said substrate on a substrate holder in said plasma processing system;

coupling direct current (DC) power at a first DC voltage to an electron source electrode opposing said substrate on said substrate holder within said plasma processing system in order to create a ballistic electron beam;

coupling alternating current (AC) power to said plasma processing system in order to form a processing plasma in said plasma processing system; and coupling DC power at a second DC voltage to a ring electrode located beyond a peripheral edge of said substrate and opposite said electron source electrode in order to increase the plasma density of said processing plasma near said peripheral edge of said substrate, wherein said coupling direct current power at a first DC voltage to an electron source electrode comprises causing secondary electron emission from the electron source electrode.

3. The method of claim 2, wherein said coupling DC power at said first DC voltage comprises coupling DC power ranging in voltage from approximately −2000 V to approximately 1000 V.

4. The method of claim 2, wherein said coupling DC power at said first DC voltage comprises coupling DC power having a negative polarity, wherein the absolute value of the DC power is greater than or equal to approximately 500 V.

5. The method of claim 2, wherein said coupling DC power at said second DC voltage comprises coupling DC power such that said second DC voltage is substantially the same value as said first DC voltage.

6. The method of claim 2, wherein said coupling DC power at said second DC voltage comprises coupling DC power such that said second DC voltage is a different value than said first DC voltage.

7. The method of claim 2, wherein said coupling DC power at said first DC voltage comprises coupling DC power to an electron source electrode comprising a doped silicon electrode plate.

8. The method of claim 2, wherein said coupling DC power at said second DC voltage to said ring electrode comprises coupling DC power to a ring electrode formed of a DC conductive material.

9. The method of claim 2, wherein said coupling DC power at said second DC voltage to said ring electrode comprises coupling DC power to a ring electrode formed of doped silicon.

10. The method of claim 2, further comprising: adjusting the DC power at said second DC voltage to said ring electrode relative to said first DC voltage in order to alter the amount of increase to the plasma density near the peripheral edge of said substrate.

11. The method of claim 2, wherein said coupling DC power at said second DC voltage to said ring electrode comprises coupling DC power to a ring electrode that is positioned on said substrate holder beyond a peripheral edge of said substrate.

12. The method of claim 11, wherein said ring electrode is disposed beyond a peripheral edge of a focus ring that rests on said substrate holder and surrounds a peripheral edge of said substrate.

13. The method of claim 2, wherein said coupling AC power comprises coupling radio frequency (RF) power to said substrate holder.

14. The method of claim 13, wherein said coupling RF power comprises coupling a first RF power to said substrate holder at a first RF frequency and coupling a second RF power to said substrate holder at a second RF frequency, wherein said second RF frequency is less than said first RF frequency.

15. A method of etching a thin film on a substrate using a plasma processing system, comprising:

disposing said substrate on a substrate holder in said plasma processing system;

coupling direct current (DC) power at a first DC voltage to an electron source electrode opposing said substrate on said substrate holder within said plasma processing system in order to create a ballistic electron beam;

coupling alternating current (AC) power to said plasma processing system in order to form a processing plasma in said plasma processing system; and coupling DC power at a second DC voltage to a ring electrode located beyond a peripheral edge of said substrate and opposite said electron source electrode in order to increase the plasma density of said processing plasma near said peripheral edge of said substrate, wherein said coupling direct current power at a first DC voltage to an electron source electrode comprises coupling said direct current power to an electrode source having an electrode plate which comprises a silicon containing electrode plate.

16. The method of claim 15 wherein the silicon containing electrode plate comprises a doped silicon containing electrode plate.

* * * * *